United States Patent [19]
Viana et al.

[11] Patent Number: 4,930,035
[45] Date of Patent: May 29, 1990

[54] RADIO FREQUENCY LIMITER CIRCUIT

[75] Inventors: Luis M. Viana, Melrose; Robert A. Cuozzo, North Andover; Michael L. Miceli, Hingham; Kent A. Whitney, Lunenburg, all of Mass.

[73] Assignee: Raytheon Company, Lexington, Mass.

[21] Appl. No.: 333,070

[22] Filed: Apr. 3, 1989

[51] Int. Cl.⁵ ............................................. H04B 15/00
[52] U.S. Cl. ........................................ 361/54; 361/58; 361/113; 361/111; 455/283; 455/287; 455/305
[58] Field of Search .................. 361/54, 58, 111, 113; 455/278, 283, 284, 287, 290, 302, 305, 311

[56] References Cited

U.S. PATENT DOCUMENTS

| | | | |
|---|---|---|---|
| 2,822,466 | 2/1958 | Neuman | 455/283 X |
| 4,063,176 | 12/1977 | Milligan et al. | 455/322 X |
| 4,480,338 | 10/1984 | Dobrovolny | 455/284 X |

*Primary Examiner*—Todd E. Deboer
*Attorney, Agent, or Firm*—Denis G. Maloney; Richard M. Sharkansky

[57] ABSTRACT

A radio frequency limiter having a radio frequency power divider having an input and a plurality of outputs; at least one diode connected in shunt with each one of the outputs of the power divider; and, a power combiner having an output and a plurality of inputs, each one of such inputs being connected to a corresponding one of the outputs of the power divider. With such arrangement, the insertion loss of such limiter is reduced compared to a limiter having a like number of diodes connected in shunt at a common point of a single transmission line. Therefore, the reduced insertion loss means that the impedance matching circuit required will not limit the maximum operating frequency to the degree an impedance matching circuit of similar complexity will limit the maximum operating frequency required for a limiter having the same number of diodes but using a single transmission line.

5 Claims, 2 Drawing Sheets

RADIO FREQUENCY LIMITER CIRCUIT

The Government has rights in this invention pursuant to Contract No. F08635-83-C-0105 awarded by the Department of the Air Force.

BACKGROUND OF THE INVENTION

This invention relates generally to radio frequency limiter circuits and more particularly to radio frequency limiter circuits adapted to operate with relatively high power.

As is known in the art, radio frequency energy limiter circuits are used in a wide variey of applications. One type of limiter circuit includes a p-i-n diode connected in shunt across a transmission line. In many case an inductor is connected in shunt with the diode. As the power fed to the transmission line increases, the effective resistance (i.e. the shunt resistance, $R_s$) of the diode decreases from a high resistance condition (whereby, in the ideal case, the power fed to the transmission line passes unattenuated to the output of the transmission line) to a low resistance condition, (whereby, in the ideal case, the power fed to the transmission line is reflected back to the input of the transmission line to limit the amount of power passing to the output of the limiter). The purpose of the inductor is to provide a discharge path during the high resistance condition for charge stored in the "i" or intrinsic region of the p-i-n diode during a preceeding time when the diode was in the low resistance condition.

In many application such limiters are required to operate with relatively high power levels. Here the breakdown voltages of the p-i-n diodes must correspondingly increase. This increase in breakdown voltage is typically achieved by increasing the volume of the intrinsic region of the p-i-n diode. However, as is known, as the intrinsic region volume is increased, the low impedance characteristic required by the diode degrades. That is, as the intrinsic region volume increases, the minimum shunt resistance achievable for the diode during the higher power level operating condition may exceed that required for the particular limiter application.

One technique used to increase the power handling capability of the diode is to use two p-i-n diodes both connected in shunt across the transmission line, but connected at points along the transmission line separated from one another by a quarter wavelength. Here the diode connected closest to the input of the limiter has a higher breakdown voltage characteristic than the diode connected closest to the output of the limiter. At low power levels both diodes in effect provided high shunt resistance conditions so that substantially all of the input power passes to the output of the limiter. As the input power increases however, while the diode connected closest to the input of the limiter maintains a somewhat higher resistance condition because of its larger intrinsic region volume, the diode connected closest to the output of the limiter is able to have its resistance reduced considerably because of its lower intrinsic region volume thereby commencing the limiting process. Further, the lowered resistance of the latter diode produces a low voltage which is reflected back to the former diode as a high voltage because of the quarter wavelength transmission line separating the two diodes. Thus, the former diode is driven to a lower resistance condition because of two effects: first, the diode is subjected to an increase in input power to the limiter; and second, the higher voltage reflected to it by the latter diode further drives it to a conducting, lower resistance condition. Thus, for high power application, the former diode, having an increased intrinsic region, is able to handle higher power levels and the concomitant ineffective low resistance charateristics of such former diode is, in effect, compensated by the use of the latter, low intrinsic region diode which provides the requisite low resistance condition.

In some high power applications it is necessary to further increase the power handling capability of the above-mentioned former diode, (i.e. the diode connected closest to the input of the limiter). Here a second high breakdown voltage diode is connected in shunt with the former diode at the same point in the transmission line. While the use of shunt connected diodes at the same point of the transmission line does reduce the power handling required for any one of the diodes, the insertion loss of the limiter is correspondingly increased. This increase in insertion loss is attributable to the fact that the intrinsic region of each diode in effect provides a capacitance in parallel with the transmission line. Thus, as additional diodes are connected in shunt, the capacitance across the transmission line increases. Since it is desirable that the input impedance to the limiter is matched to the impedance of the source of radio frequency energy or power fed to the limiter, matching circuitry must be provided; however, as the capacitance increases from using additional shunted diodes, the complexity of the matching circuit increases, and correspondingly, the operating bandwidth and maximum operating frequency of the limiter decreases thereby restricting the application of the limiter.

SUMMARY OF THE INVENTION

With this background of the invention in mind, it is therefore an object of this invention to provide an improved radio frequency limiter circuit.

It is a further object of this invention to provide a radio frequency limiter circuit having improved high power capability.

It is a further object of the invention to provide a radio frequency limiter adapted to operate with high power levels over a relatively wide bandwidth.

It is still a further object of the invention to provide a radio frequency limiter circuit adapted to operate with high power over a wide band of frequency and have relatively small insertion loss.

These and other objects of the invention are obtained generally by providing a radio frequency limiter comprising: a radio frequency power divider having an input and a plurality of outputs; at least one diode coupled in shunt with each one of the outputs of the power divider; and, a power combiner, having an output and a plurality of inputs, each one of such inputs being connected to a corresponding one of the outputs of the power divider.

With such arrangement, the insertion loss of such limiter is reduced compared to a limiter having a like number of diodes connected in shunt at a common point of a single transmission line. Therefore, the reduced insertion loss means that the impedance matching circuit required will not limit the maximum operating frequency to the degree an impedance matching circuit of similar complexity will limit the maximum operating frequency required for a limiter having the same number of diodes but using a single transmission line.

BRIEF DESCRIPTION OF THE DRAWINGS

The furthering features of this invention, as well as the invention itself, may be more fully understood from the following detailed description read together with the accompanying drawings, in which.

DESCRIPTION OF THE PREFERRED EMBODIMENT

Figure 1A:
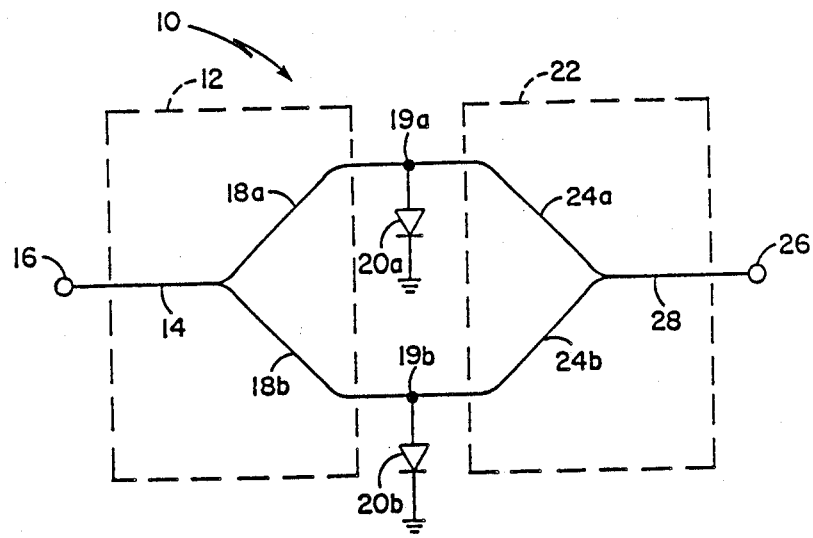
FIGS. 1A and 1B are simplified schematic diagrams useful in comparing the insertion loss of the limiter circuit and power dissipation in diodes used in the limiter circuit according to the prior art and according to the invention, respectively.

Referring now to FIG. 1A, a radio frequency energy limiter circuit 10 is shown to include a power divider 12, here a 2:1 power divider having: an input transmission line section 14, connected to an input port 16; and, a plurality of, here 2, output transmission line sections 18a, 18b. Terminating each one of the output transmission line sections 18a, 18b, at junctions 19a, 19b, respectively is a diode 20a, 20b, respectively, as shown. Diodes 20a, 20b are here p-i-n diodes having substantially matched impedances with the result that power fed to input port 16 of power divider 12 is divided substantially equally between output transmission line sections 18a, 18b. A power combiner 22, here a 2:1 power combiner, has input transmission line sections 24a, 24b connected to the output transmission line sections 18a, 18b, respectively, at the junctions 19a, 19b, respectively, as shown. The pair of input transmission line sections 24a, 24b have power passing through them combine, and the combined power is fed to output port 26 of the limiter 10 via output transmission line section 28 of combiner 22.

In operation, when the level of the radio frequency power fed to the limiter 10 at input port 16 is relatively low, diodes 20a, 20b provide a relatively high resistance, or ideally open circuit characteristic, with therefore substantially all of this low level power, after dividing equally between output transmission line sections 18a, 18b, passes through input transmission line sections 24a, 24b to become combined in output transmission line section 28 and hence appear substantially unlimited at output port 26. It is noted, however, that in the the non-ideal case, each one of the diodes 20a, 20b has an insertion loss associated with it. Thus, if for example, each one of the diodes 20a, 20b has a 0.3 db insertion loss at x-band, 93 percent of such power will pass through input transmission line section 24a. The same will be true for diode 20b. Thus, if the power fed to input port 16 is Pi, neglecting the insertion loss of the power divider 12, the power fed to each one of the diodes 20a, 20b is 0.5 Pi. Thus, the power transmitted through each one of the input transmission line sections 24a, 24b will be (0.93)(0.5) Pi and the power at the output port 26 will be 0.93 Pi. The insertion loss of the entire limiter 10, again neglecting the insertion loss of the power divider 12, is thus 0.3 db.

Figure 1B:
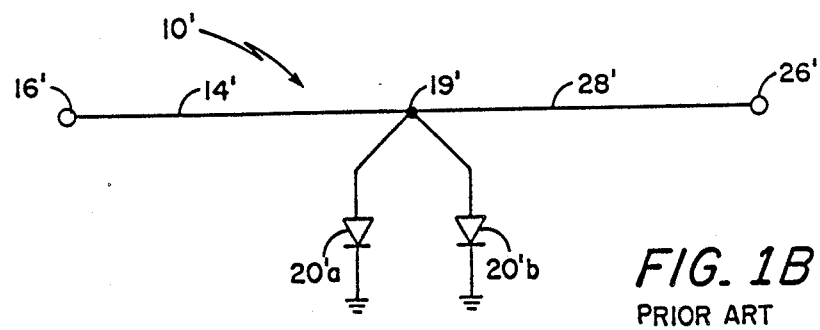

Referring now to FIG. 1B, a limiter 10' according to the prior art is shown to include a single transmission line section 14' coupled to input port 16'. A pair of p-i-n diodes 20'a, 20'b are shown terminating input transmission line section 14' at junction 19'. An output transmission line section 28' connects junction 19' to output port 26'. The p-i-n diodes 20'a, 20'b are here assumed to be identical to diodes 20a, 20b described in connection with FIG. 1A. Further, the characteristic impedance of transmission line section 14' is $Z_o$, here again 50 ohms. The insertion loss per diode 20'a, 20'b is here again 0.3 db as it was for each of diodes 20a, 20b of FIG. 1A. Further, under high power conditions the resistance of each one of the forward biased diodes 20'a, 20'b is R, here 60 ohms as it was for diodes 20a, 20b. Thus, considering first the insertion loss of limiter 10' at the low power level condition, if the power applied to input port 16' is again Pi, each diode 20'a, 20'b, will provide 0.3 db of insertion loss. Therefore, each one of the diodes 20'a, 20'b will transmit 93 percent of the power fed to junction 19' with the result that 7 percent of the power is lost per diode, for a total of 14% and thus only 86 percent of the power applied to input port 16' will appear at output port 26' under low power conditions. The insertion loss of the power limiter 10' is thus 0.6 db. Hence, the limiter 10 shown in FIG. 1A has 0.3 db less insertion loss compared with limiter 10' shown in FIG. 1B; however, it is noted that the above analysis assumed that the power divider 12 used in the limiter 10, and not used in the limiter 10', does in the practical case, have a finite insertion loss. However, the insertion loss of the power divider/combiner 12, 22 through proper design may be constructed to be less than 0.3 db, and more typically may be 0.1 db. Thus, in the practical case, the insertion loss of limiter 10 (FIG. 1A) according to the invention is about 0.4 db while the insertion loss of limiter 10' (FIG. 1B) according to the prior art is 0.6 db. This reduced insertion means that any input impedance matching circuit required will not limit the maximum operating frequency of the limiter 10 to the degree required for the input impedance matching circuit required for the prior art limiter 10'.

Figure 2:
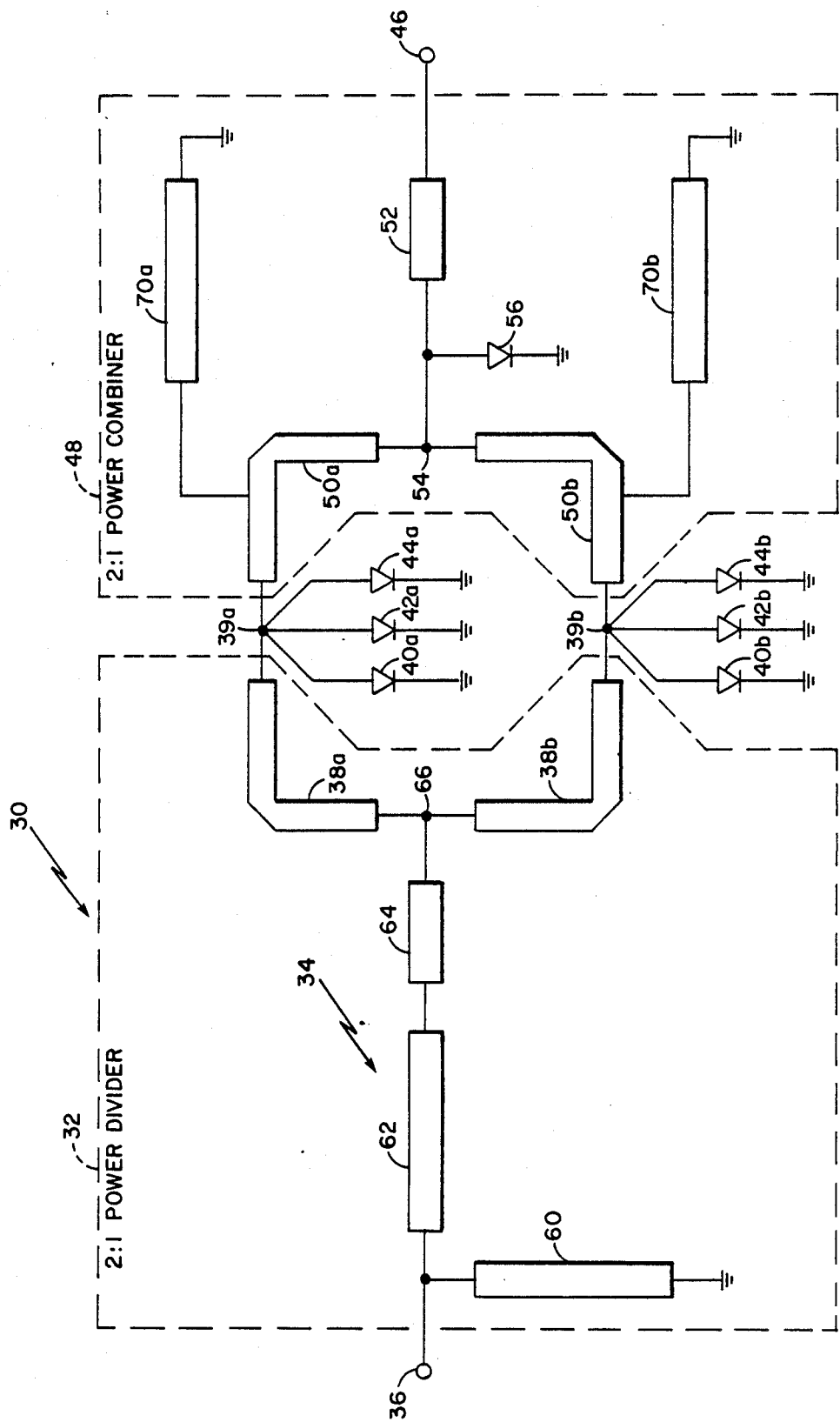
FIG. 2 is a schematic diagram of a radio frequency limiter circuit according to the invention.

The concepts described in connection with the limiter 10 (FIG. 1) may be extended to limiters which use a plurality of diodes at each one of the junctions 19a, 19b. Thus, referring to FIG. 2, a more detailed schematic is shown of a radio frequency power limiter circuit 30 according to a preferred embodiment of the invention. Thus, limiter circuit 30 is shown to include a power divider 32, here a 2:1 power divider. The power divider 32 includes an input impedance matching section 34 connected between an input port 36 and a pair of output transmission line sections 38a, 38b. A plurality of, here three, p-i-n diodes 40a, 42a, 44a, terminate output transmission line section 38a at junction 39a. Likewise a like plurality of, here three, p-i-n diodes 40b, 42b, 44b, terminate output transmission line section 38b at junction 39b. Because here the junctions 39a, 39b are not isolated because of the particular power divider used, the p-i-n diodes 40a, 42a, 44a are matched in impedance to the p-i-n diodes 40b, 42b, 44b in order that the power fed to input port 36 divides equally between output transmission line sections 38a, 38b. Had the power divider used been a Wilkinson divider, or 3 db hybrid coupler, the junctions 39a, 39b would be electrically isolated from each other and hence the requirement for diode matching would be relaxed.

Connected between junctions 39a, 39b and output port 46 is a 2:1 power combiner 48. Power combiner 48 includes a pair of input transmission line sections 50a, 50b connected to junctions 39a, 39b, respectively as shown, and an output transmission line section 52 for combining energy fed to it via sections 50a, 50b. The energy combined in transmission line section 52 is passed through it to output port 46. Connected to the junction 54 joining the output end of input transmission line sections 50a, 50b and the input end of output transmission line section 52 is a p-i-n diode 56. The p-i-n diode 56 here has a much lower threshold voltage, and hence a small intrinsic region volume, than the diodes 40a, 42a, 44a, 50b, 42b, 44b, connected to junctions 39a, 39b. Further, input transmission line sections 50a, 50b are here 90 ohms, one-quarter wavelength transmission line section so that junctions 39a, 39b are one-quarter wavelength spaced from junction 54. Thus, while under low power conditions diodes 40a, 42a, 44a, 40b, 42b, 44b are in a high impedance condition along with diode 56, as the power fed to the limiter 30 at input port 36 increases to higher power levels, diode 56 with its small intrinsic region, provides a low resistance (i.e. approaches a short circuit condition) at junction 54. This low resistance condition creates a low voltage at junction 54 which, because of the quarter wave length of lines 50a, 50b, reflects at junctions 39a, 39b as a high voltage thus, in addition to the increased applied power, assists in biasing diodes 40a, 42a, 44a, 40b, 42b, 44b to a conducting condition and, because of their higher intrinsic region voltage (and thus higher breakdown voltage characteristic), are able to dissipate the major portion of the requisite power dissipation under the high power condition. Thus, from the discussion above in connection with FIGS. 1A and 1B it may likewise be shown that, for a resistance of 60 ohms for the three diodes 40a, 42a, 44a, 40b, 42b, 44b, at each of the junctions 39a, 39b, and for 50 ohm transmission line sections 38a, 38b with a 50 ohm input impedance matching section 34 and a 50 ohm power source (not shown) at input port 36, the power dissipated by each one of the six diodes 40a, 42a, 44a, 40b, 42b, 44b is approximately 8 percent of the power fed to input port 36. It should be noted that had six similar diodes been used across a single transmission line, the power dissipated for each diode would have been 7 percent of the applied power; substantially the same. However, considering the insertion loss effect of using these diodes 40a, 42a, 44a, 40b, 42b, 44b in shunt with each of the two output transmission line sections 38a, 38b and with a 0.1 db insertion loss assumed for the power divider/combiner 32, 48 and diode 56, the insertion loss for limiter 30 is 1.3 db compared to an insertion loss 2.1 db for a limiter according to the prior art having six diodes at the same junction of a single transmission line.

Completing the limiter 10, the input impedance matching section 34 here includes: a 60 ohm, 90 degree phase shift (quarter wave length) transmission line section 60 connected between input port 36 and ground; a 50 ohm, 90 degree and 30 ohm, 55 degree transmission line sections 62, 64, respectively, connected between the input port 36 and the junction 66 at the input ends of the output transmission line sections 38a, 38b. The output transmission line sections 38a, 38b are here 50 ohm, quarter wavelength transmission line sections. The network 34 thus here provides a 50 ohm input impedance to a power source (not shown) coupled to input port 36. A capacitive stub 64 and shorted stub 60 are provided to tune the limiter 30. A pair of quarter wavelength 100 ohm transmission line sections 70a, 70b are connected between suitable intermediate points of transmission line sections 50a, 50b and ground to provide a d-c path for charge stored in the intrinsic region of diodes 40a, 42a, 44a, 50b, 42b and 44b during their conducting conditions to return to ground during the non-conducting conditions of such diodes. Thus, transmission line sections 70a, 70b may be considered as grounded inductors.

Figure 3:
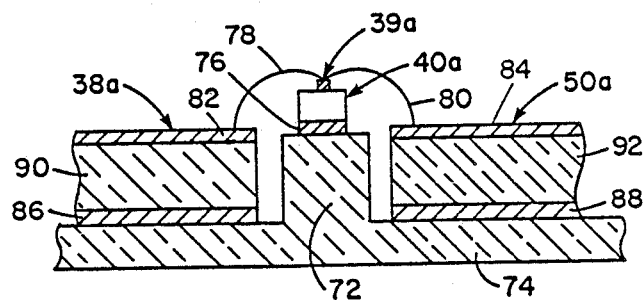
FIG. 3 is a cross section elevation view, somewhat distorted, of a portion of the limiter circuit of FIG. 2 showing the bonding of a diode used in such circuit to a package for such circuit.

The limiter 30 is suitable for fabrication as a microstrip transmission line circuit, a portion of which is as shown in FIG. 3. Here, the diodes 40a, 44a, 46a, 40b, 44b, 46b, here only diode 40a being shown in FIG. 3 are attached to pedestal portion 72 of a copper package 74 using a eutectic die attach method to reduce the effect of the diodes thermal resistance. Thus, the diode 40a has a gold electrode 76 on the back side thereof eutectically bonded to the pedestal 72. The diode 40a should be ultrasonically scrubbed onto the package 74 at a high temperature (380° C.). Only the gold electrode 76 on the back side of the diode 40a and on the pedestal 72 are used to make the metallurgical bond. No intermediate solder preforms should be used. The material for package 74 is here copper so as to provide a low thermal resistance. Gold wires 78, 80 are used to connect the strip conductors 82, 84, respectively, of microstrip transmission line sections 38a, 50a, respectively. The strip conductors 82, 84 are here gold and are separated in a conventional manner from gold ground plane conductors 86, 88 by suitable dielectric substates 90, 92, respectively, here alumina.

Having described a preferred embodiment of the invention, it is now evident to those of skill in the art that other embodiments incorporating these concepts may be used. For example, power divider other than 2:1 power dividers may be used. It is felt, therefore, that other inventions should not be restricted to the disclosed embodiments, but rather should be limited only by the spirit and scope of the appended claims.

What is claimed is:

1. A radio frequency limiter circuit, comprising:
   (a) a radio frequency power divider having an input and a plurality of outputs;
   (b) a corresponding plurality of diodes, with each one of said diodes having a first electrode connected to a corresponding one of the plurality of outputs of the power divider and a second electrode connected to a reference potential; and
   (c) a power combiner, having an output and a plurality of inputs, each one of such inputs being connected to a corresponding one of the outputs of the power divider.

2. The radio frequency limiter circuit recited in claim 1 including an additional diode connected in shunt with the output of the power combiner.

3. The radio frequency limiter circuit recited in claim 1 wherein each one of the diodes is a p-i-n diode.

4. The radio frequency limiter circuit recited in claim 2 wherein the additional diode is a p-i-n diode.

5. The radio frequency limiter circuit recited in claim 4 wherein the additional p-i-n which has an intrinsic region volume less than the intrinsic region volume of the p-i-n diodes coupled in shunt with the outputs of the power divider.

* * * * *